(12) United States Patent
Sepehrband et al.

(10) Patent No.: US 11,908,131 B2
(45) Date of Patent: Feb. 20, 2024

(54) MAPPING BRAIN PERIVASCULAR SPACES

(71) Applicant: UNIVERSITY OF SOUTHERN CALIFORNIA, Los Angeles, CA (US)

(72) Inventors: Farshid Sepehrband, Los Angeles, CA (US); Jeiran Choupan, Los Angeles, CA (US)

(73) Assignee: UNIVERSITY OF SOUTHERN CALIFORNIA, Los Angeles, CA (US)

( * ) Notice: Subject to any disclaimer, the term of this patent is extended or adjusted under 35 U.S.C. 154(b) by 342 days.

(21) Appl. No.: 17/176,725

(22) Filed: Feb. 16, 2021

(65) Prior Publication Data

US 2021/0256691 A1 Aug. 19, 2021

Related U.S. Application Data

(60) Provisional application No. 62/976,696, filed on Feb. 14, 2020.

(51) Int. Cl.
*G06T 7/00* (2017.01)
*G01R 33/50* (2006.01)
(Continued)

(52) U.S. Cl.
CPC ............ *G06T 7/0012* (2013.01); *G01R 33/50* (2013.01); *G01R 33/5608* (2013.01);
(Continued)

(58) Field of Classification Search
CPC ...... G06T 7/0012; G06T 7/11; G06T 2207/10028; G06T 2207/10092; G06T 2207/20024; G06T 2207/20084; G06T 2207/20221; G06T 2207/30016; G06T 2207/30096; G06T 7/62; G06T 7/13;
(Continued)

(56) References Cited

U.S. PATENT DOCUMENTS

| | | | |
|---|---|---|---|
| 2011/0199084 A1* | 8/2011 | Hasan | G06T 1/00 324/309 |
| 2016/0000945 A1* | 1/2016 | Nedergaard | A61K 38/10 604/9 |

(Continued)

OTHER PUBLICATIONS

Contrast Enhancement by Combining T1- and T2-weighted Structural Brain MR Images (Year: 2015).*

*Primary Examiner* — Vu Le
*Assistant Examiner* — Winta Gebreslassie
(74) *Attorney, Agent, or Firm* — SNELL & WILMER LLP

(57) ABSTRACT

Systems and methods for mapping brain perivascular spaces. A system may include a memory to store one or more images of a brain of a patient. The system may further include a processor coupled to the memory. The processor may be configured to obtain a first and a second image of the brain. The processor may be further configured to combine the first image and the second image to preserve and magnify structures including the brain perivascular spaces within the image of the brain. The processor may be further configured to determine the brain perivascular spaces within the combined image of the brain of the patient. The processor may be further configured to generate a three-dimensional (3-D) map of the perivascular spaces. The system may further include a display configured to display the perivascular spaces to an operator.

13 Claims, 12 Drawing Sheets

(51) Int. Cl.
    *G01R 33/56*         (2006.01)
    *G01R 33/563*       (2006.01)
    *G06T 7/11*           (2017.01)

(52) U.S. Cl.
    CPC .......... *G01R 33/56341* (2013.01); *G06T 7/11* (2017.01); *G06T 2207/10028* (2013.01); *G06T 2207/10092* (2013.01); *G06T 2207/20024* (2013.01); *G06T 2207/20084* (2013.01); *G06T 2207/20221* (2013.01); *G06T 2207/30016* (2013.01); *G06T 2207/30096* (2013.01)

(58) Field of Classification Search
    CPC . G06T 2207/10076; G06T 2207/10088; G06T 2207/20036; G06T 2207/30101; G01R 33/50; G01R 33/56341; G01R 33/5608; A61B 5/0042; A61B 5/055; G06F 18/2113; G06F 18/25; G06V 10/267; G06V 2201/03
    See application file for complete search history.

(56) References Cited

U.S. PATENT DOCUMENTS

2017/0039708 A1\*   2/2017   Henry .................. G06T 7/0012
2020/0074214 A1\*   3/2020   Boespflug ............ A61B 5/0042

\* cited by examiner

MAPPING BRAIN PERIVASCULAR SPACES

CROSS REFERENCE TO RELATED APPLICATIONS

This application claims the benefit and priority of U.S. Provisional Application Ser. No. 62/976,696, entitled "Mapping Brain Perivascular Spaces," filed on Feb. 14, 2020, the contents of which are hereby incorporated by reference in its entirety herein.

STATEMENT AS TO FEDERALLY SPONSORED RESEARCH

This invention was made with government support under grant numbers 2P41EB015922-21, 1P01AG052350-01, R01NS100973 and USC ADRC 5P50AG005142 awarded by the National Institute of Health (NIH). The government has certain rights in this invention.

BACKGROUND

1. Field

The present disclosure relates to systems and methods for a fully automated mapping of brain perivascular spaces, particularly, using magnetic resonance image (MRI) scans.

2. Description of the Related Art

Imaging perivascular spaces (PVS), also known as Virchow-Robin spaces, has significant clinical value. PVS are pial-lined, fluid-filled structures that accompany vessels entering (i.e., penetrating arteries) or leaving (i.e., draining veins) the cerebral cortex. Due to the extensive vascularity of the brain, PVS occupy a large portion of the cerebral tissue. PVS volume varies across people, enlarges with aging as brain tissue shrinks, and changes in many neurological diseases. PVS play a major role in the clearance system. Accommodating the influx of cerebrospinal fluid (CSF) to brain parenchyma through peri-arterial space and the efflux of interstitial fluid to the lymphatic system through peri-venous space enables non-invasive imaging of the glia-lymphatic pathway.

In the clinical practice, PVS are quantified based on the number of visible PVS on the axial slice of a T2-weighted (T2w) image that has the highest number of PVS in the region of interest. This process can be laborious and prone to error, and, as such, efforts to improve efficiency and accuracy have been made by using a wide range of automatic or semi-automatic segmentation techniques, from classical image processing approaches to deep neural network modeling.

However, less effort has been made to enhance the visibility of PVS through postprocessing means. Thus, systems and methods for enhancing the visibility of PVS is needed.

SUMMARY

Described herein are systems and methods for mapping brain PVS using various imaging techniques. The imaging techniques may include PVS mapping using T1-weighted (T1w) and T2w images. The technique may increase PVS visibility on MRI and accurately quantify PVS in the brain. The imaging techniques may further include biophysical modeling of PVS fluid. The technique may incorporate PVS fluid in diffusion MRI data analysis by compartmentalizing diffusion signal into parenchymal and fluid signals. The imaging techniques may further include PVS segmentation in the presence of brain lesions. The technique may utilize fluid-attenuated inversion recovery (FLAIR) images. FLAIR images may be used to exclude non-PVS false positives.

In accordance with an embodiment of the current disclosure, there may be a system for mapping brain PVS. The system may include a memory to store one or more images of a brain of a patient. The system may further include a processor coupled to the memory. The processor may be configured to obtain a first image of the brain of the patient. The processor may be further configured to obtain a second image of the brain of the patient. The processor may be further configured to combine the first image and the second image to preserve and magnify structures including the brain PVS within the image of the brain of the patient. The processor may be further configured to determine the brain PVS within the combined image of the brain of the patient. The processor may be further configured to generate a three-dimensional (3-D) map of the PVS within the brain of the patient. The system may further include a display configured to display PVS of the brain of the patient to an operator.

The 3-D map of the brain PVS may indicate a caliber, a distribution, an amount, a number, a volume or volume fraction and/or a density of the brain PVS within the brain and within each region of the brain. The processor may be configured to generate statistics of the brain PVS. The statistics may include the caliber, the distribution, the amount, the number, the volume or the volume fraction and/or the density of the brain PVS within the brain and within each region of the brain. The processor may be further configured to provide the statistics of the brain PVS to the operator. The statistics may indicate, correlate with or relate to a neurological disease condition.

The first image and the second image may be high-resolution scans having different modalities with different contrasts from an MRI. The different modalities may include a T1w modality and a T2w modality that contrasts white matter and fluid patterns inversely in comparison to the T1w modality. The high-resolution scans may have a resolution of approximately 0.7 mm or less. The first image and the second image may be low-resolution scans obtained from clinical data. The low-resolution scans may have a resolution of approximately 1 mm or greater.

The processor may be configured to perform pre-processing of the first image and the second image including at least one of non-uniform intensity normalization, motion correction, alignment correction, Talairach transform computation, skull stripping, and/or intensity normalization. The processor may be further configured to filter high-frequency noise from the first image and the second image to reduce high-frequency noise within the first image and the second image.

To determine the brain PVS, the processor may be configured to apply a Frangi filter that provides a likelihood or a probability of each voxel being a brain PVS in the combined image. The processor may be further configured to, for each voxel, determine that the voxel is the brain PVS when the likelihood or the probability of the voxel is greater than or equal to a threshold value. The threshold value may be modeled based on neurological data.

In accordance with another aspect of the current disclosure, there may be a system for mapping brain PVS using clinical data. The system may include a memory to store one or more images of a brain of a patient. The system may further include a processor coupled to the memory. The processor may be configured to obtain a first image of the brain of the patient. The processor may be further configured to determine the brain PVS within the first image of the brain of the patient. The processor may be further configured to generate a 3-D map of the brain PVS. The system may further include a display configured to display or render an image of the brain PVS of the brain of the patient to an operator. The display or rendering of the image of the brain PVS of the brain may be overlaid on an image of the brain.

The processor may be configured to obtain a second image of the brain of the patient. The second image of the brain may be a low-resolution image. The processor may be further configured to interpolate data points within the second image of the brain to have the same resolution as the first image of the brain of the patient. The processor may be further configured to co-register the second image of the brain into the first image of the brain. The first image may have a T1w modality. In such embodiment, the processor may be further configured to combine the first image with another image having a FLAIR modality that suppresses fluids in the first image while providing a high contrast for lesions including segmenting or excluding lesions or microbleeds from the first image based on the first image and the other image having the FLAIR modality. The processor may be further configured to optimize lesion detection techniques using machine learning.

To determine the brain PVS, the processor may be configured to apply a Frangi filter that provides a likelihood or a probability of each voxel being a brain perivascular space. The processor may be further configured to, for each voxel, determine that the voxel is the brain PVS when the likelihood or the probability of the voxel is greater than or equal to a threshold value. The threshold value may be modeled based on neurological data.

In accordance with an embodiment of the present disclosure, there may be a method for analyzing brain PVS. The method may include obtaining a first image of a brain of a patient. The method may further include obtaining a second image of the brain of the patient. The method may further include combining the first image and the second image to preserve and magnify structures including the brain PVS within the brain of the patient. The method may further include determining the brain PVS within the combined image of the brain of the patient. The method may further include determining fluid characteristics within the brain. The method may further include generating a map of the brain PVS along with fluid characteristics within the brain of the patient. The method may further include displaying the map of the brain PVS along with the fluid characteristics within the brain of the patient.

The method may further include obtaining diffusion MRI scans over a period of time. Determining the fluid characteristics within the brain may include measuring or determining diffusion or motion hydrogen molecules at the microscopic or molecular level using diffusion MRI scans over the period of time. Determining the diffusion or the motion of the hydrogen molecules may include decomposing or separating the diffusion or the motion of the hydrogen molecules inside white matter diffusion or fluid diffusion based on a speed of a motion or the motion of the hydrogen molecules. The fluid diffusion may be a faster diffusion than the white matter diffusion.

BRIEF DESCRIPTION OF THE DRAWINGS

Other systems, methods, features, and advantages of the present disclosure will be apparent to one skilled in the art upon examination of the following figures and detailed description. Component parts shown in the drawings are not necessarily to scale and may be exaggerated to better illustrate the important features of the present disclosure.

DETAILED DESCRIPTION

The systems and methods described herein may automatically map brain PVS using MRI scans. The mapping of brain PVS may quantify brain clearance pathways which may be used as a clinical biomarker or a prognosis marker for various neurological diseases and/or may be used to guide neurosurgery. In some embodiments, the systems and methods may include obtaining two images of a brain of a patient having different modalities (e.g., Tw1, Tw2, EPC) and combine the two images to advantageously generate and display 3-D map of the PVS within the brain. The systems and methods may further include advantageously generating and providing to an operator statistics of the brain PVS indicating, correlating with, or relating to a neurological disease condition. Additional image sequences (e.g. FLAIR) may be advantageous to discern PVS from pathological changes (e.g., white matter hyperintensities). Multi-modal approach for PVS quantification may further improve misclassification of vessels. In some embodiments, the systems and methods may include obtaining a single image of the brain of the patient. The single image may have a T1w modality. The systems and methods may further include advantageously generating and displaying a 3-D map of the PVS within the brain based on the single image. The systems and methods may further include determining fluid characteristics within the brain and advantageously generating and displaying the map of the brain PVS along with the fluid characteristics within the brain.

Figure 1:
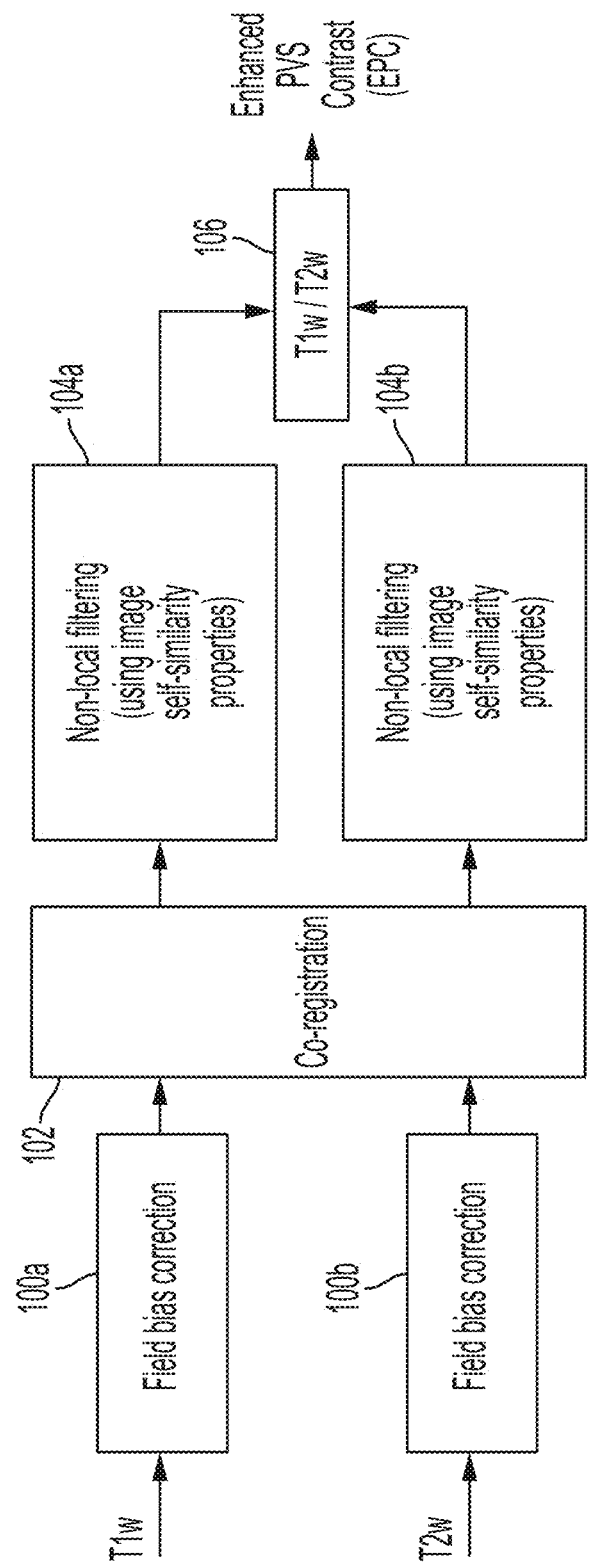
FIG. 1 is a flowchart depicting an enhanced perivascular space contrast (EPC) technique according to an aspect of the present disclosure.

FIG. 1 is a flowchart depicting an EPC technique according to an aspect of the present disclosure. The flowchart shows steps that may obtain EPC. EPC may improve the conspicuity of the PVS, resulting in detection of a significantly larger number of PVS identified by expert or clinical readers. In block 100a, a brain image having a T1w modality may be preprocessed. The brain image may be corrected for gradient nonlinearity, readout, and/or field bias. In block 100b, a brain image having a T2w modality may be preprocessed. The brain image may be corrected for gradient nonlinearity, readout, and/or field bias. In block 102, the brain images having the T1w and T2w modalities may be co-registered. The brain images may be interpolated. In block 104a, the brain image having the T1w modality may be filtered using an adaptive non-local mean filtering technique. The technique may involve measuring image intensity similarities by account for neighboring voxels in a blockwise fashion. The filtered image may be defined as follows:

$$\Sigma_{x_j \in v_i} \omega(x_i, x_j) u(x_j) \tag{1}$$

For each voxel $(x_j)$, weight $(\omega)$ may be measured using the Euclidean distance between 3-D patches. The adaptive non-local mean filtering technique adds a regularization term to the above expression to remove bias intensity of the Rician noise observed in an MRI. The expected Euclidian distances between two noisy patches may be defined as follows:

$$d(N_i, N_j) = \|u_0(N_i) - u_0(N_j)\|^2 + 2\sigma^2 \tag{2}$$

The two noisy patches may be expressed as $N_i$ and $N_j$. If $N_i = N_j$, the equation (2) may be simplified as:

$$d(N_i, N_j) = 2\sigma^2 \tag{3}$$

The Rician noise of the MRI images may be estimated by using the noise level for non-local filtering. Filtering may be applied only on high frequency spatial noises to preserve PVS voxels while removing the noise. This may be achieved by using a filtering patch with, for example, a radius of 1 voxel. The filtering patch may remove the noise at a single-voxel level and preserve signal intensities that may be spatially repeated.

In block 104b, the brain image having the T2w modality may be filtered using an adaptive non-local mean filtering technique. The adaptive non-local mean filtering technique explained in discussing block 104a may be used in filtering the brain image having the T2w modality.

In block 106, the filtered images may be divided (i.e., T1w/T2w). The division may enhance PVS contrast. As such, the division may yield the EPC. The EPC may improve the conspicuity of the PVS and aid resolving a larger number of PVS. Operators may detect substantially higher number of PVS when using EPC in comparison to conventional imaging methods known in the art.

Figure 2A:
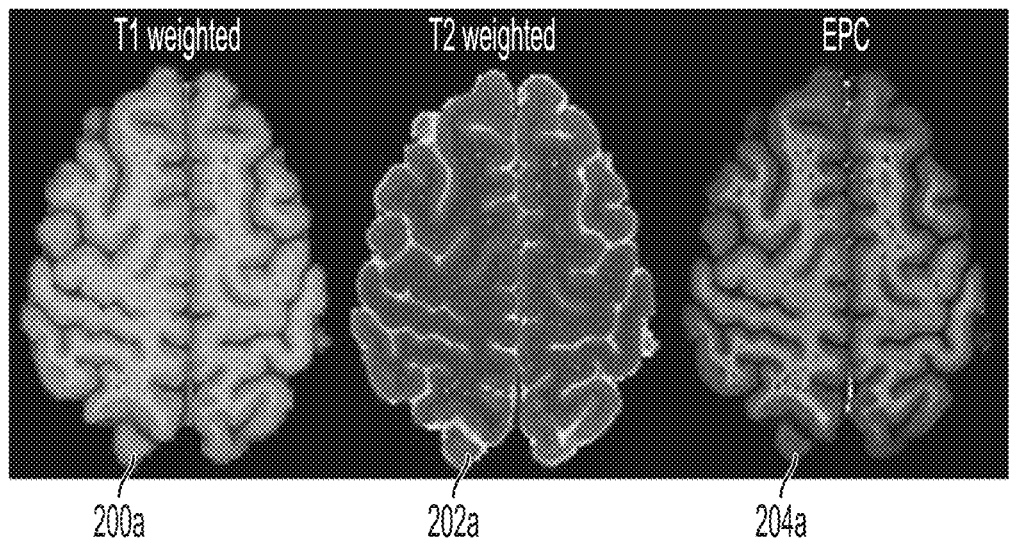
FIG. 2A illustrates a comparison of brain images with high PVS having a T1w modality, a T2w modality, and an EPC according to an aspect of the present disclosure.
Figure 2B:
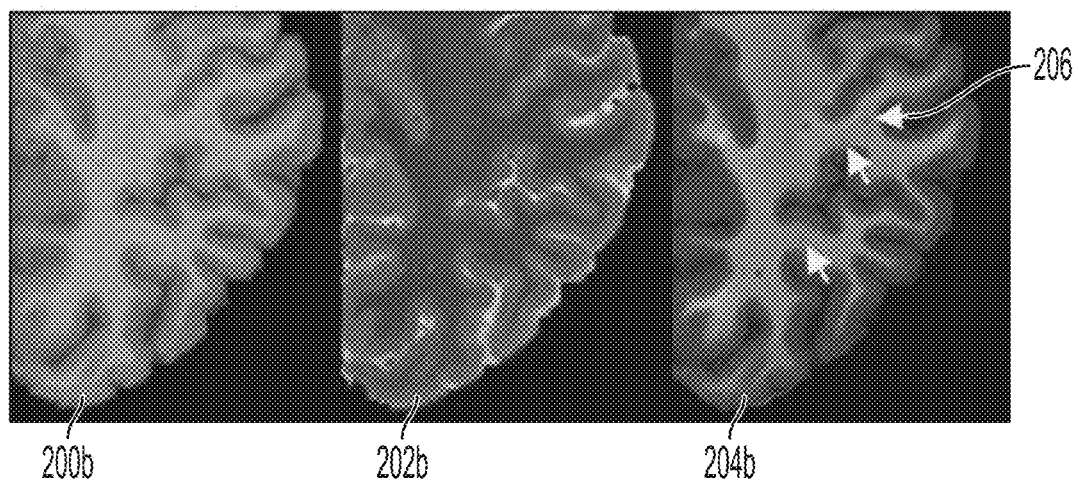
FIG. 2B illustrates a comparison of brain images with low PVS having a T1w modality, a T2w modality, and an EPC according to an aspect of the present disclosure.

FIG. 2A illustrates a comparison of brain images with high PVS having a T1w modality 200a, a T2w modality 202a, and an EPC 204a. FIG. 2B illustrates a comparison of brain images with low PVS having a T1w modality 200b, a T2w modality 202b, and an EPC 204b. FIGS. 2A-2B show white matter, the tissue through which messages pass between different areas of grey matter within the central nervous system. The brain images are of a cognitively normal individual by example. The images having the EPC 204a,b may allow detection of PVS that may be hardly visible in images having the Tw1 modality 200a,b, and the Tw2 modality 202a,b. Arrows 206 of FIG. 2B point to the PVS that may be difficult to identify in the images 200a,b, 202a,b. Contrast between the PVS and the white matter may be higher in the images having the EPC 204a,b compared to those of the images 200a,b, 202a,b. The contrast may be approximately twice higher.

Figure 3A:
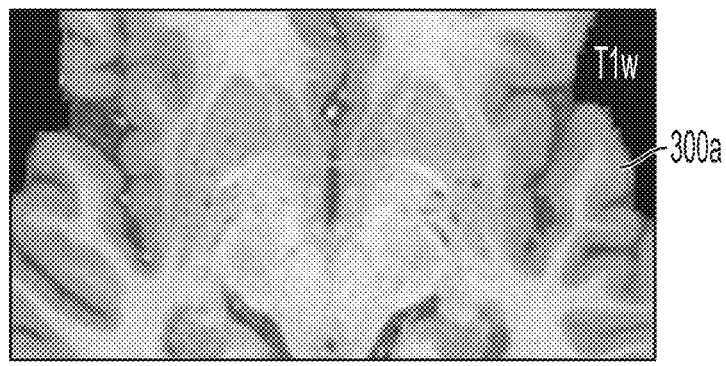
FIG. 3A illustrates an image of a basal ganglia having a T1w modality according to an aspect of the present disclosure.
Figure 3B:
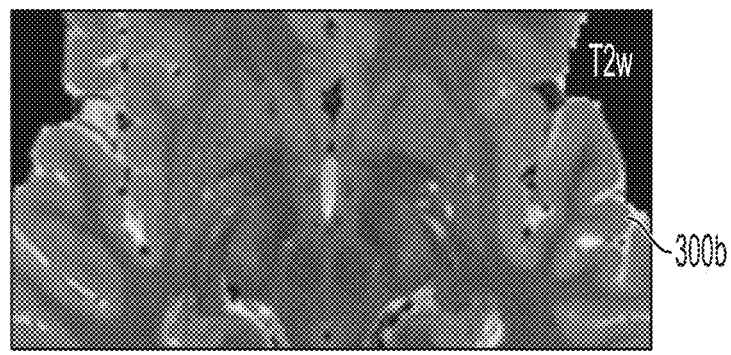
FIG. 3B illustrates an image of the basal ganglia having a T2w modality according to an aspect of the present disclosure.
Figure 3C:
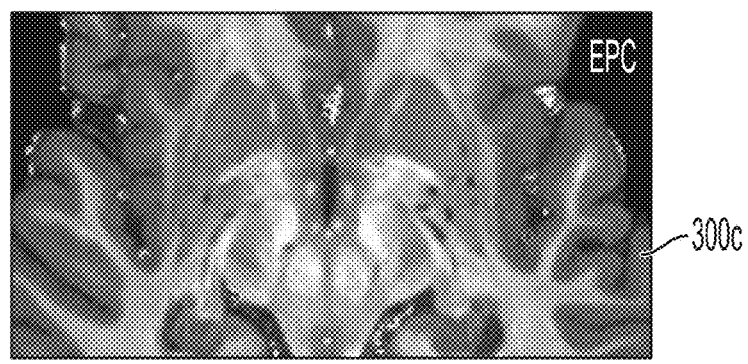
FIG. 3C illustrates an image of the basal ganglia having an EPC according to an aspect of the present disclosure.

FIG. 3A illustrates an image 300a of a basal ganglia having a T1w modality. FIG. 3B illustrates an image 300b of the basal ganglia having a T2w modality. FIG. 3C illustrates an image 300c of the basal ganglia having an EPC according to an aspect of the present disclosure. FIGS. 3A-3C show the basal ganglia, a group of structures found within the cerebral hemispheres responsible primarily for motor control, as well as other roles such as motor learning, executive functions and behaviors, and emotions. The image 300c having the EPC may allow detection of PVS that may be hardly visible in images 300a,b having the Tw1 modality and the Tw2 modality.

Figure 4A:
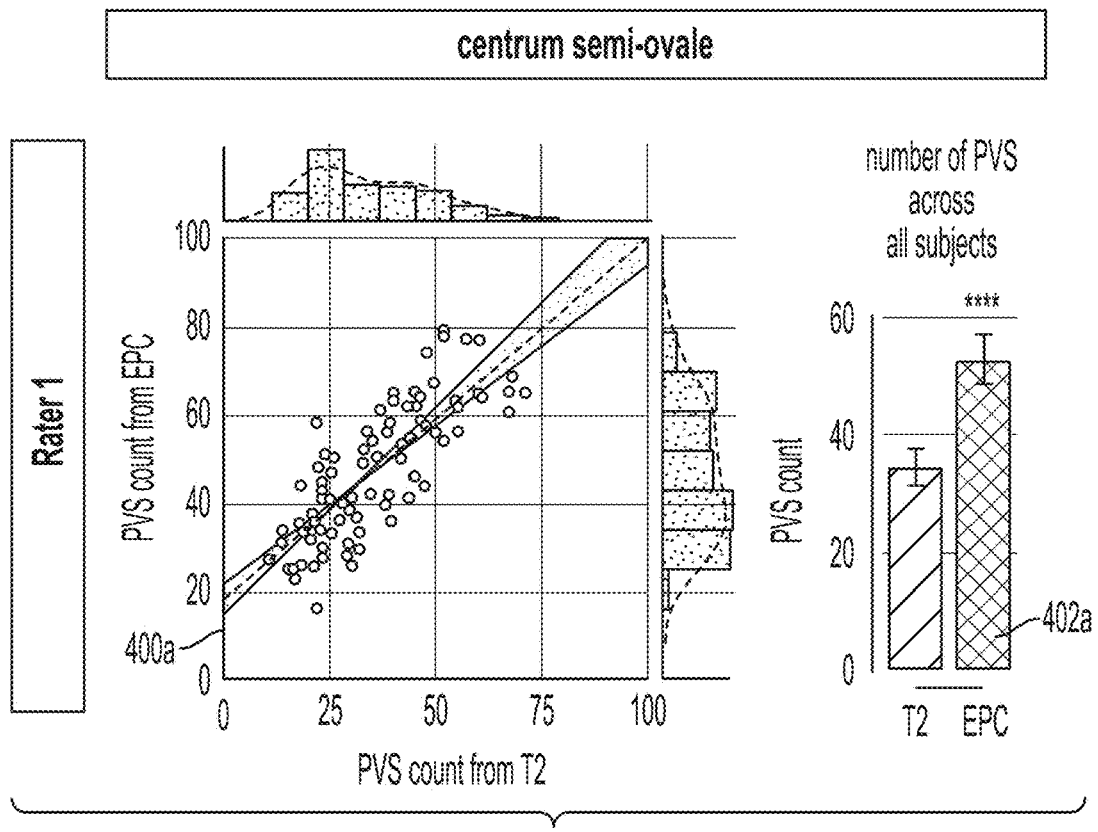
FIG. 4A is a graph plotting a correlation between a number of PVS counted by a first rater on images of a centrum semi-ovale having a T2w modality and an EPC and their distribution and a graph comparing a mean and a standard deviation of PVS data derived from the images according to an aspect of the present disclosure.

FIG. 4A is a graph 400a plotting a correlation between a number of PVS counted by a first rater or reader on images of a centrum semi-ovale having a T2w modality and an EPC and their distribution and a graph 402a comparing a mean and a standard deviation of PVS data derived from the images. As shown in the graphs 400a, 402a a higher number of PVS is counted in the centrum semi-ovale by the first rater when EPC is used compared to when T2w is used. For example, when EPC is used, more than 40 PVS may be counted and when T2w is used more than 30 PVS may be counted. More particularly, when EPC is used, approximately 47 PVS may be counted on average. The EPC PVS count may have an approximate standard deviation of plus (+) or minus (−) 15. On the other hand, when T2w is used, approximately 34 PVS may be counted on average. The T2w PVS count may have an approximate standard deviation of plus (+) or minus (−) 14.

Figure 4B:
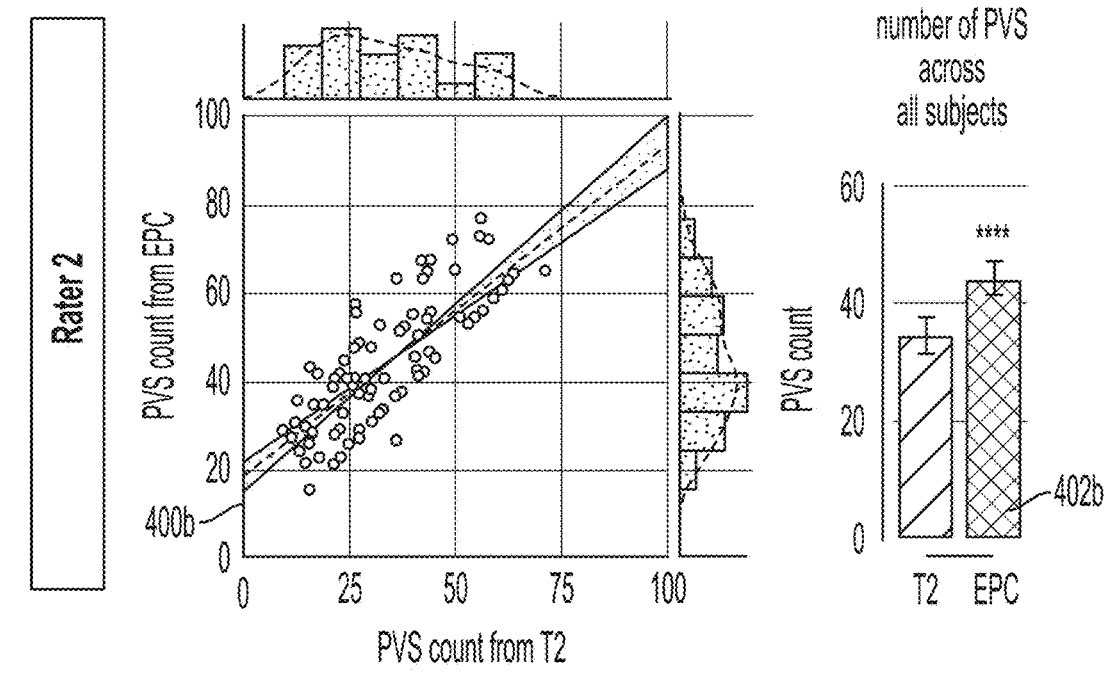
FIG. 4B is a graph plotting a correlation between a number of PVS counted by a second rater on images of the centrum semi-ovale having a T2w modality and an EPC and their distribution and a graph comparing a mean and a standard deviation of PVS data derived from the images according to an aspect of the present disclosure.

FIG. 4B is a graph 400b plotting a correlation between a number of PVS counted by a second rater or reader on images of the centrum semi-ovale having a T2w modality and an EPC and their distribution and a graph 402b comparing a mean and a standard deviation of PVS data derived from the images. As shown in the graphs 400b, 402b, a higher number of PVS is counted in the centrum semi-ovale by the second rater when EPC is used compared to when T2w is used. For example, when EPC is used, more than 40 PVS may be counted and when T2w is used more than 30 PVS may be counted. More particularly, when EPC is used, approximately 44 PVS may be counted on average. The EPC PVS count may have an approximate standard deviation of plus (+) or minus (−) 14. On the other hand, when T2w is used, approximately 34 PVS may be counted on average. The T2w PVS count may have an approximate standard deviation of plus (+) or minus (−) 15. The inter-rater reliability and concordance may be increased when EPC is used. For example, average inter-class coefficients may be 0.96 for T2w and 0.98 for EPC. In another example, Lin's concordance coefficients may be 0.92 for T2w and 0.94 for EPC.

Figure 4C:
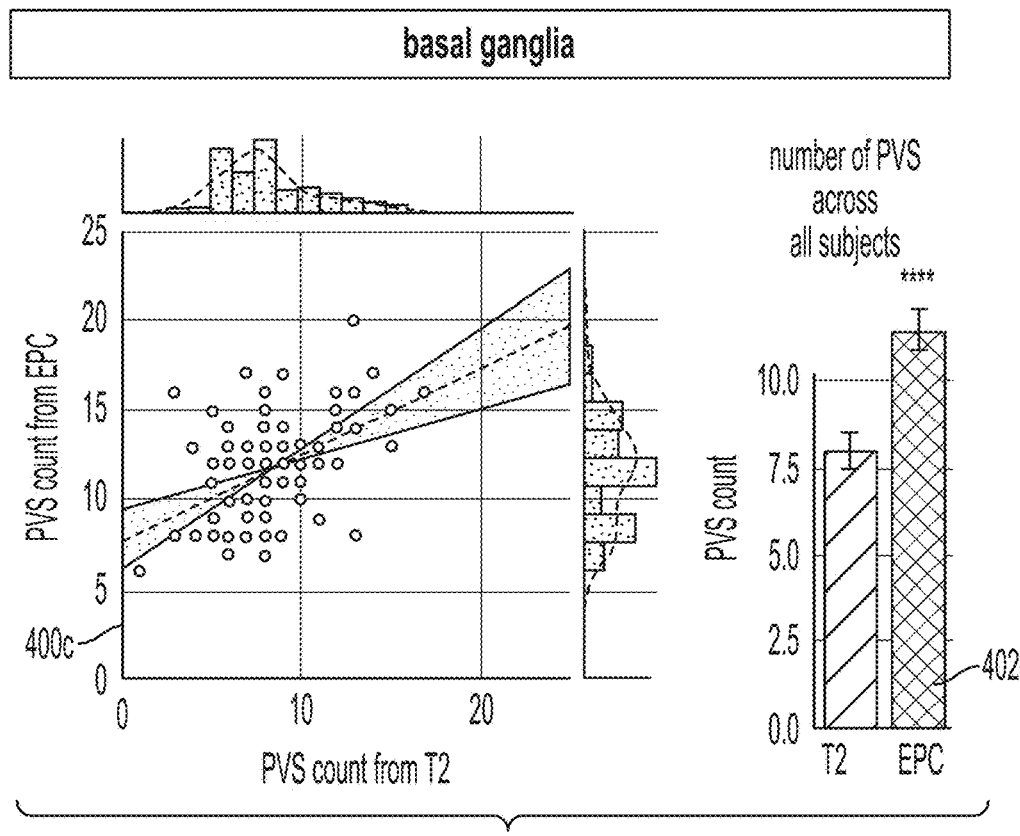
FIG. 4C is a graph plotting a correlation between a number of PVS counted by the first rater on images of the basal ganglia having a T2w modality and an EPC and their distribution and a graph comparing a mean and a standard deviation of PVS data derived from the images according to an aspect of the present disclosure.

FIG. 4C is a graph 400c plotting a correlation between a number of PVS counted by the first rater or reader on images of the basal ganglia having a T2w modality and an EPC and their distribution and a graph 402c comparing a mean and a standard deviation of PVS data derived from the images. As shown in the graphs 400c, 402c a higher number of PVS is counted in the basal ganglia by the first rater when EPC is used compared to when T2w is used. For example, when EPC is used, more than 10 PVS may be counted and when T2w is used more than 5 PVS may be counted. More particularly, when EPC is used, approximately 12 PVS may be counted on average. The EPC PVS count may have an approximate standard deviation of plus (+) or minus (−) 3. On the other hand, when T2w is used, approximately 8 PVS may be counted on average. The T2w PVS count may have an approximate standard deviation of plus (+) or minus (−) 3. However, a lower correlation between the PVS count obtained from T2w and EPC may be observed in the basal ganglia compared to the PVS counts in the centrum semi-ovale plotted in FIGS. 4A-4B.

Figure 4D:
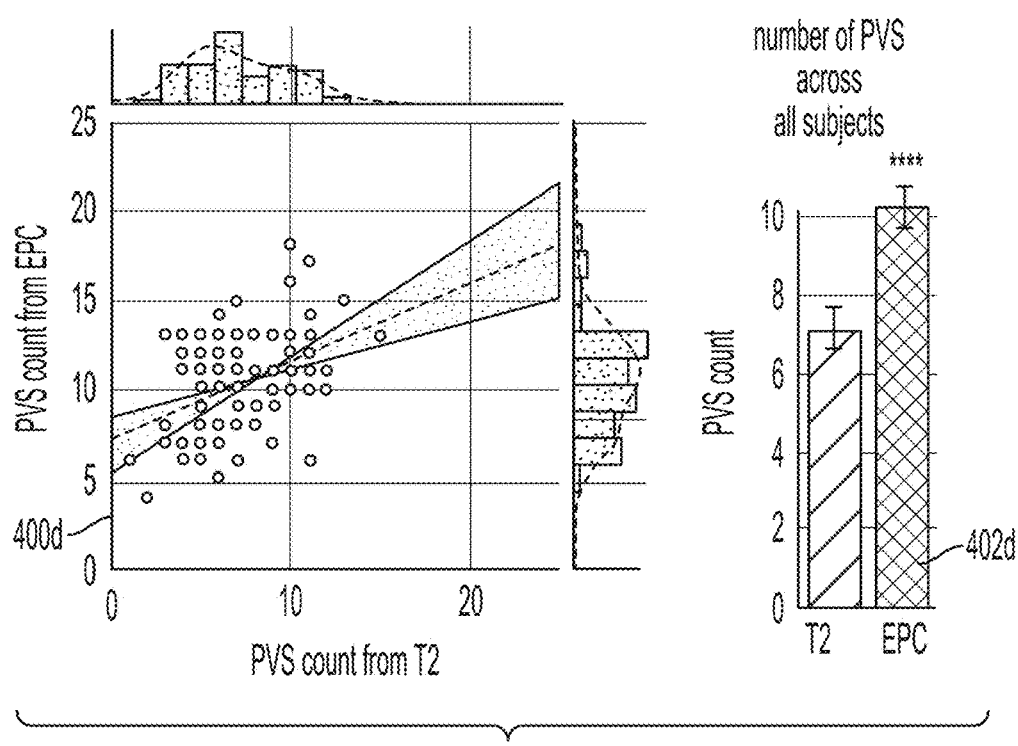
FIG. 4D is a graph plotting a correlation between a number of PVS counted by the second rater on images of the basal ganglia having a T2w modality and an EPC and their distribution and a graph comparing a mean and a standard deviation of PVS data derived from the images according to an aspect of the present disclosure.

FIG. 4D is a graph 400d plotting a correlation between a number of PVS counted by the second rater or reader on images of the basal ganglia having a T2w modality and an EPC and their distribution and a graph 402d comparing a mean and a standard deviation of PVS data derived from the images. As shown in the graphs 400d, 402d, a higher number of PVS is counted in the basal ganglia by the second rater when EPC is used compared to when T2w is used. For example, when EPC is used, more than 10 PVS may be counted and when T2w is used more than 5 PVS may be counted. More particularly, when EPC is used, approximately 10 PVS may be counted on average. The EPC PVS count may have an approximate standard deviation of plus (+) or minus (−) 3. On the other hand, when T2w is used, approximately 7 PVS may be counted on average. The T2w PVS count may have an approximate standard deviation of plus (+) or minus (−) 3. The inter-rater reliability and concordance may be increased when EPC is used. For example, average inter-class coefficients may be 0.87 for T2w and 0.92 for EPC. In another example, Lin's concordance coefficients may be 0.74 for T2w and 0.77 for EPC.

Figure 5A:
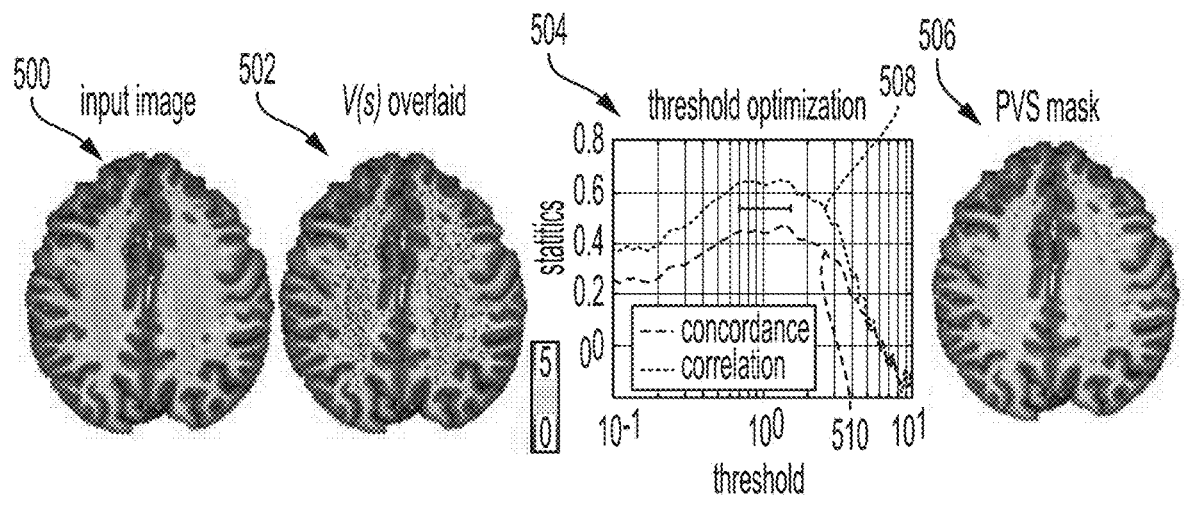
FIG. 5A illustrates a brain image having an EPC, a vesselness map of the image obtained from Frangi filtering, a graph plotting optimization results to find an optimum global threshold for the EPC, and the image having a PVS mask according to an aspect of the present disclosure.

FIG. 5A illustrates a brain image 500 having an EPC, a vesselness map 502 of the image obtained from Frangi filtering, a graph 504 plotting optimization results to find an optimum global threshold for the EPC, and the image having a PVS mask 506. FIG. 5 demonstrates the results of automated PVS quantification, segmentation, and mapping using MRI. The brain image 500 may be an input image. Preprocessed data may be used for automatic quantification. The preprocessing may include motion correction, non-uniform intensity normalization, Talairach transform computation, intensity normalization, and skull stripping. Then, non-local mean filtering may be applied. MRI images may be parcellated to extract masks of white matter and basal ganglia, using an n-tissue parcellation technique of the Advanced Normalization Tools (ANTs) software package or any other suitable software appreciated in the art. The parcellated brain, including white matter and basal ganglia, may be used as a mask for PVS quantification analysis.

For automated quantification, PVS may be segmented using Frangi filtering. Additionally, PVS may optimized for maximum concordance with clinical readings. Frangi filtering may be applied to EPC images using Quantitative Imaging Toolkit or any other suitable toolkit appreciated in the art. In some embodiments, Frangi filtering may be applied to T1w or T2w images. Frangi filtering may estimate a vesselness measure for each voxel V(s) from eigenvectors $\lambda$ of the Hessian matrix H of the image 500. The Frangi filtering may be expressed as follows:

$$\mathcal{V}(s) = \begin{cases} 0 & \text{if } \lambda_2 > 0 \text{ or } \lambda_3 > 0, \\ \left(1 - \exp\left(-\frac{\mathcal{R}_A^2}{2\alpha^2}\right)\right) \exp\left(-\frac{\mathcal{R}_B^2}{2\beta^2}\right) \left(1 - \exp\left(-\frac{S^2}{2c^2}\right)\right) \end{cases} \quad (4)$$

$$\mathcal{R}_A = \frac{|\lambda_1|}{|\lambda_2|}, \quad (5)$$

$$\mathcal{R}_B = \frac{|\lambda_1|}{\sqrt{|\lambda_2 \lambda_3|}},$$

$$S = \|H\|.$$

Default parameters of α=0.5, β=0.5 and c may be used by example. The parameter c may be set to half the value of the maximum Hessian norm. The Frangi filter may estimate vesselness measures at different scales and provide maximum likeliness. The scale may be set to a range of 0.1 to 5 voxels in order to maximize the vessel inclusion. The output of this step may be the quantitative vesselness map 502. The range corresponds the specific levels in scale space that may be searched by a tubular structure feature detector. Thus, the outputs across voxels include vesselness measured across a range of filter scales.

In order to obtain the PVS mask 506, the vesselness map 502 may be thresholded. The binary PVS mask 506 may enable automated PVS counting, volumetric, and spatial distribution analysis. Given that the vesselness value could vary across modalities, the threshold may be optimized for a particular input image 500 separately. The number of PVS counted by clinal readers may be used for threshold optimization. Vesselness values may be standardized via scaling. The scaling may be performed according to the inter-quartile range (IQR) to avoid influence of large outliers. The scaled vesselness values may be expressed as follows:

$$\hat{V}(s) = \frac{V(s) - V_{min}}{IQR(V)} \quad (6)$$

The binary image of the PVS mask 506 may be obtained by thresholding $\hat{V}(s)$, which may be expressed as follows:

$$P(s) = \begin{cases} 1 & \hat{V}(s) \geq t \\ 0 & \text{otherwise} \end{cases} \quad (7)$$

Then, the automated estimate of the PVS count may be obtained by totaling the number of connected components of the PVS mask 506 or P(s). Optimum thresholds may be found by maximizing the concordance with the expert or clinical visual reading. The concordance may be used instead of an absolute difference to optimize for a global threshold and avoid biasing the threshold toward rater counts. The optimum threshold may be expressed as follows:

$$\bar{t} = \max_{0 < t \leq 10} \tau(a, e) + \rho(a, e) \quad (8)$$

Variables a and e may be one-dimensional arrays of PVS counts, obtained from the automated (a) and expert (e) readings, respectively. Kandall's tau (τ) and Spearman's Rho (ρ) may be used to measure concordance and correlation. An average of expert readings from the input image 500 having an EPC may be used for optimization. For example, an optimum threshold of 2.3, 2.7, and 1.5 may be used for T1w, T2w, and EPC, respectively. Optimum thresholds may be different for different input images 500.

A dilated mask of ventricles may be subtracted from an initial PVS mask to exclude periventricular voxels and remove any incorrectly segmented PVS at a lateral ventricles-white matter boundary. After obtaining the final PVS mask 506, the number of PVS may be obtained by counting the number of connected components of the PVS mask 506. Small components, for example, less than 5 voxels, may be excluded from automated counting to minimize noise contribution.

The graph 504 shows optimization results to find an optimum global threshold for EPC. By example, t=1.5 may provide the optimum threshold which leads to the highest concordance shown in line 508 and Spearman's correlation shown in line 510 with clinical readings. In other examples, t=2.3 may provide the optimum threshold for T1w and t=2.7 may provide the optimum threshold for T2w.

Figure 5B:
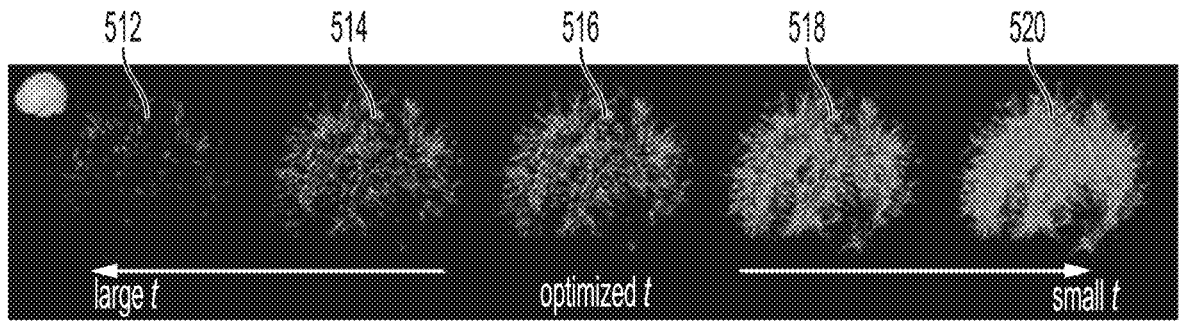
FIG. 5B illustrates a comparison of brain images having PVS masks having a range of threshold values according to an aspect of the present disclosure.

FIG. 5B illustrates a comparison of brain images having a range of threshold values applied to the PVS mask 506 (see FIG. 5A). Image 512 may have the highest threshold selection on the PVS mask 506. Image 514 may have the second highest threshold selection on the PVS mask 506. Image 516 may have an optimized threshold selection on the PVS mask 506. Image 518 may have the second smallest threshold selection on the PVS mask 506. Image 520 may have the smallest threshold selection on the PVS mask 506. The threshold selections are exemplary and are ranked by value relative to each other only. As evident from FIG. 5B, a too small (i.e., image 520) or too high (i.e., image 512) threshold may result in a large number of false positives or false negatives, respectively.

Figure 6A:
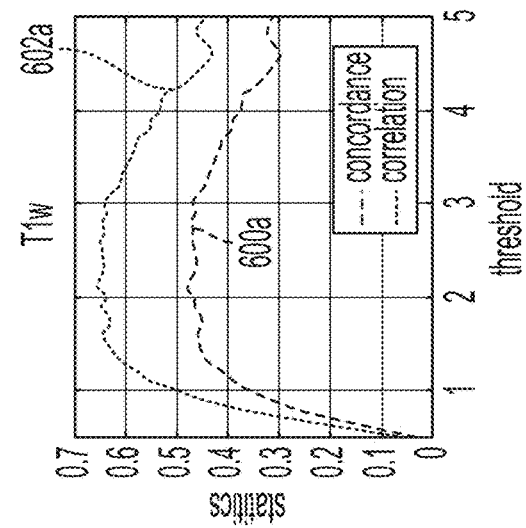
FIG. 6A is a graph plotting optimum threshold for segmenting PVS for the T1w modality according to an aspect of the present disclosure.
Figure 6C:
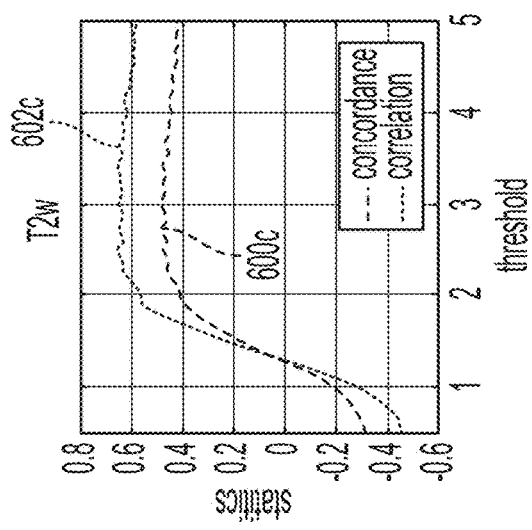
FIG. 6C is a graph plotting optimum threshold for segmenting PVS for the T2w modality according to an aspect of the present disclosure.
Figure 6E:
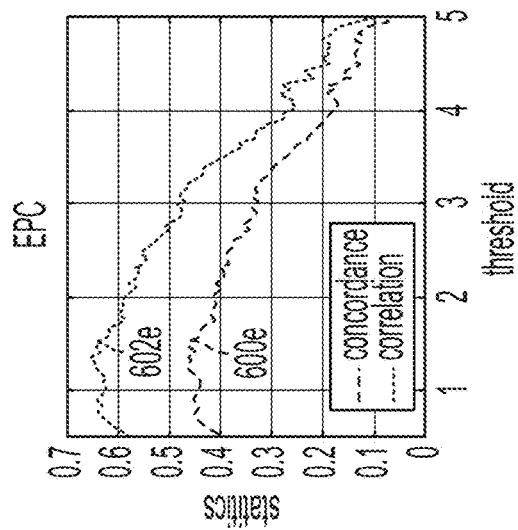
FIG. 6E is a graph plotting optimum threshold for segmenting PVS for the EPC according to an aspect of the present disclosure.
Figure 6B:
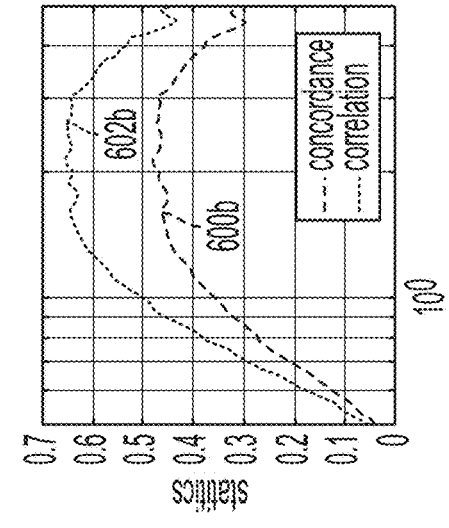
FIG. 6B is a graph plotting optimum threshold in a logarithmic scale for segmenting PVS for the T1w modality according to an aspect of the present disclosure.
Figure 6D:
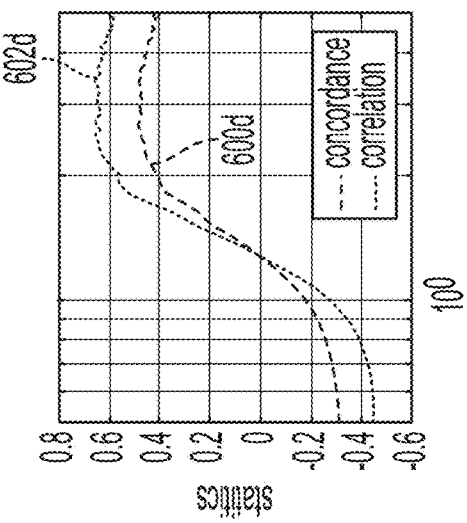
FIG. 6D is a graph plotting optimum threshold in a logarithmic scale for segmenting PVS for the T2w modality according to an aspect of the present disclosure.
Figure 6F:
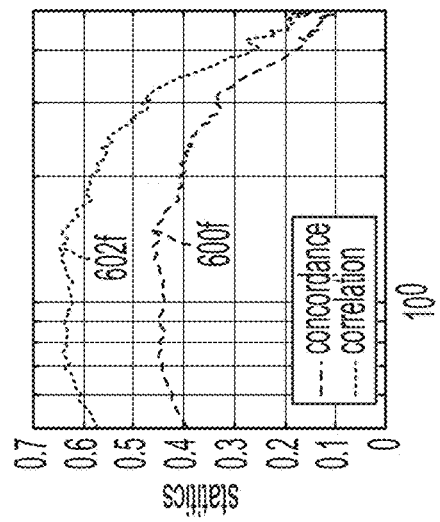
FIG. 6F is a graph plotting optimum threshold in a logarithmic scale for segmenting PVS for the EPC according to an aspect of the present disclosure.

FIG. 6A is a graph plotting optimum threshold for segmenting PVS for the T1w modality. The graph shows concordance indicated by line 600*a* and correlation indicated by line 602*a* of automated PVS quantification with clinical readings for different threshold values. FIG. 6B is a graph plotting optimum threshold in a logarithmic scale for segmenting PVS for the T1w modality. The graph shows concordance indicated by line 600*b* and correlation indicated by line 602*b* of automated PVS quantification with clinical readings for different threshold values. FIG. 6C is a graph plotting optimum threshold for segmenting PVS for the T2w modality. The graph shows concordance indicated by line 600*c* and correlation indicated by line 602*c* of automated PVS quantification with clinical readings for different threshold values. FIG. 6D is a graph plotting optimum threshold in a logarithmic scale for segmenting PVS for the T2w modality. The graph shows concordance indicated by line 600*d* and correlation indicated by line 602*d* of automated PVS quantification with clinical readings for different threshold values. FIG. 6E is a graph plotting optimum threshold for segmenting PVS for the EPC. The graph shows concordance indicated by line 600*e* and correlation indicated by line 602*e* of automated PVS quantification with clinical readings for different threshold values. FIG. 6F is a graph plotting optimum threshold in a logarithmic scale for segmenting PVS for the EPC. The graph shows concordance indicated by line 600*f* and correlation indicated by line 602*f* of automated PVS quantification with clinical readings for different threshold values. As shown in FIGS. 6A-6F, the threshold may be optimum for a wide range, and as such may warrant a visual inspection of the threshold.

Figure 7A:
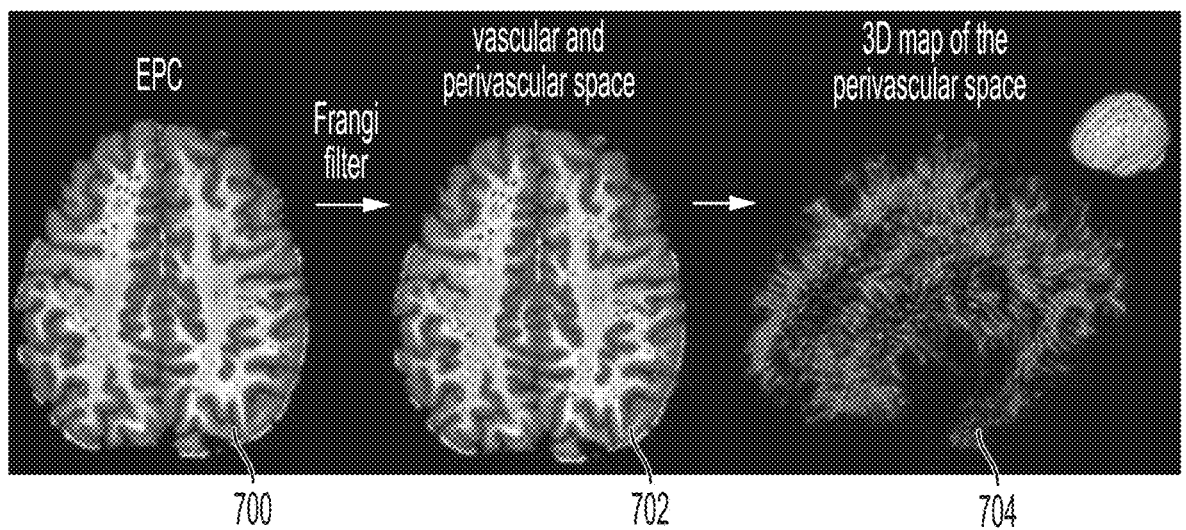
FIG. 7A illustrates PVS segmentation using the Frangi filter with an optimum threshold according to an aspect of the present disclosure.

FIG. 7A illustrates PVS segmentation using the Frangi filter with an optimum threshold. Image 700 is an input EPC image of the brain. Image 702 is an image of the brain with the Frangi filter applied to the image 700. Image 702 may show both vascular space and PVS. Image 704 may show a 3-D map of the PVS. As shown in image 702, the Frangi filter may detect tubular structures of the PVS.

Figure 7B:
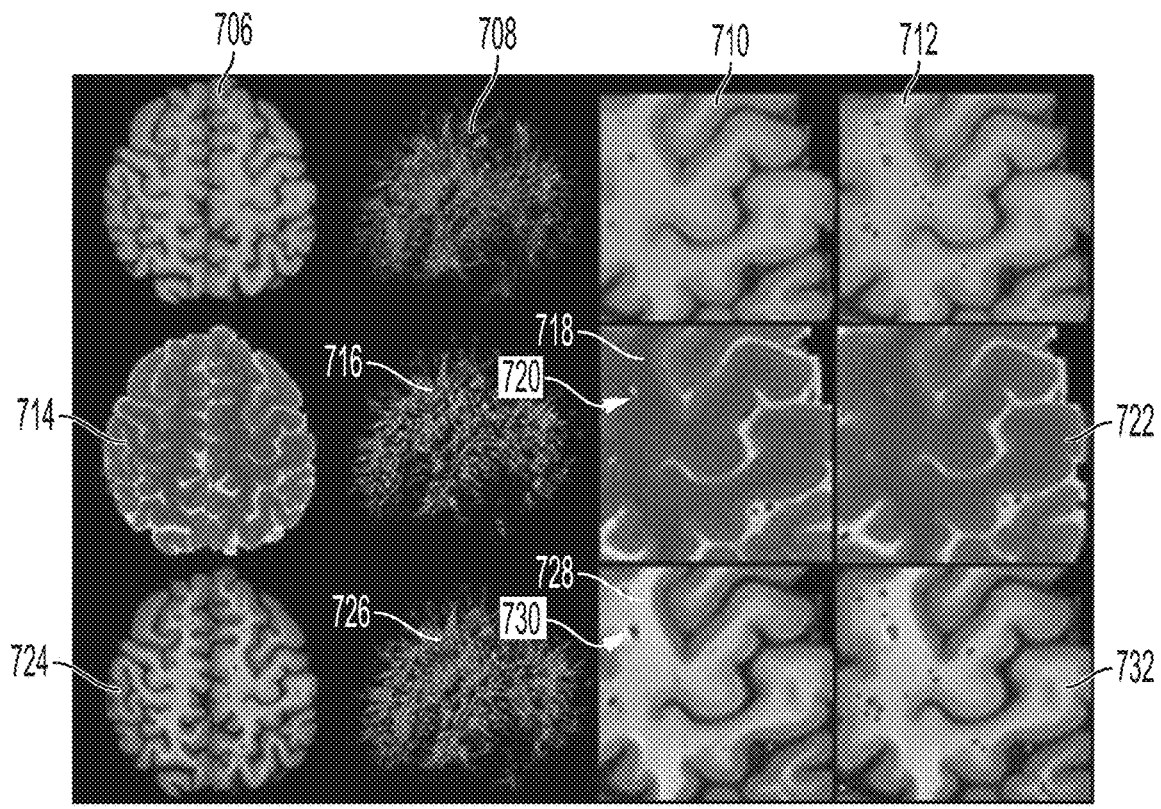
FIG. 7B illustrates a comparison of automated segmentation where T1w, T2w, and EPC are used as input according to an aspect of the present disclosure.

FIG. 7B illustrates a comparison of automated segmentation where T1w, T2w, and EPC are used as input. Image 706 is an input image of the brain having a T1w modality. Image 708 is a 3-D PVS map of the image 706. Image 710 is a close-up sectional view of the image 706. Image 712 is a close-up sectional view of the image 706 having a Frangi filter. Image 714 is an input image of the brain having a T2w modality. Image 716 is a 3-D PVS map of the image 714. Image 718 is a close-up sectional view of the image 714. Image 718 may have voxels with an artifact indicated by arrow 720. The artifact may be Gibbs ringing and/or an internal gradient artifact. Image 722 is a close-up sectional view of the image 714 having a Frangi filter. Image 724 is an input image of the brain having an EPC. Image 726 is a 3-D PVS map of the image 724. Image 728 is a close-up sectional view of the image 724. Image 728 may have voxels with an artifact indicated by arrow 730. The artifact may be Gibbs ringing and/or an internal gradient artifact. Image 732 is a close-up sectional view of the image 724 having a Frangi filter.

Figure 8A:
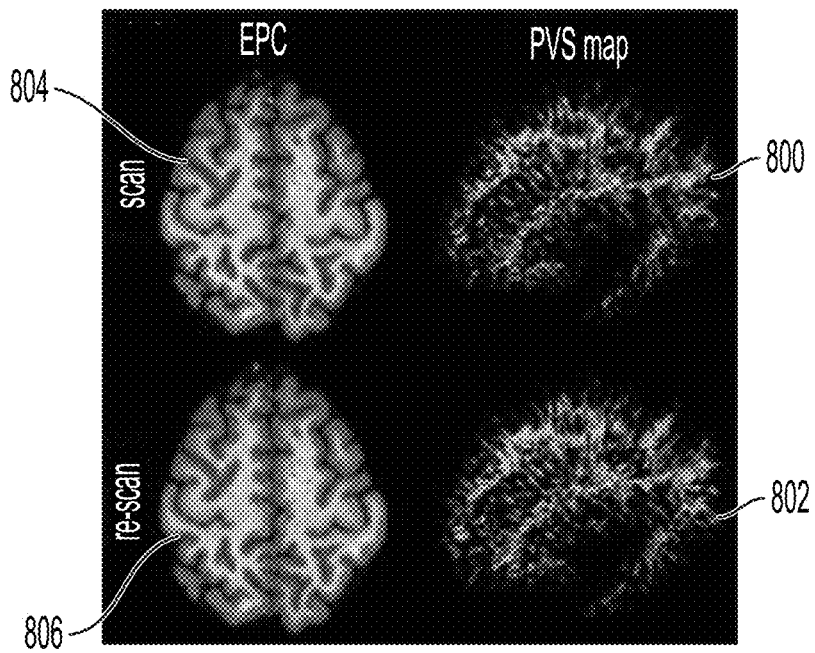
FIG. 8A illustrates a scan map and a rescan map of a brain scan image and a brain rescan image having an EPC and a PVS mask according to an aspect of the present disclosure.

FIG. 8A illustrates a scan map 800 and a rescan map 802 of a brain image 804 and a brain rescan image 806 having an EPC and a PVS mask. The scan map 800 and the rescan map 802 demonstrate the test-retest reliability of PVS quantification with MRI. An automated quantification pipeline may be applied to the scan-rescan images.

Figure 8B:
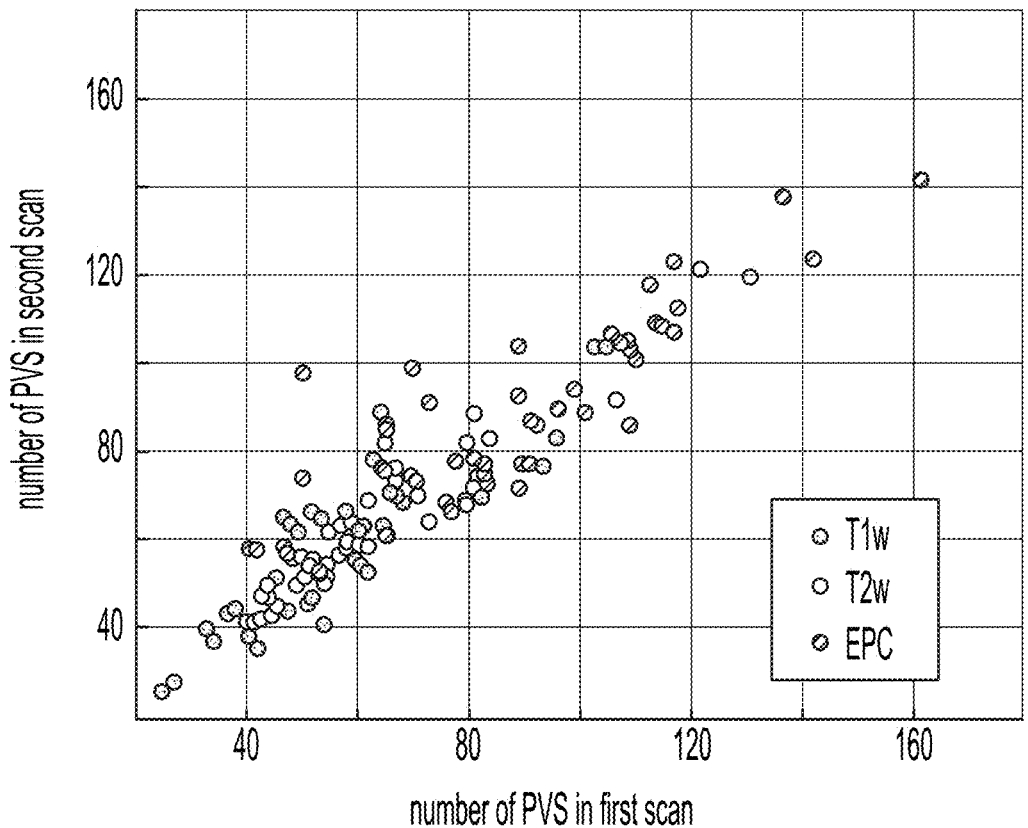
FIG. 8B is a graph plotting a total number of counted PVS in scan data and rescan data obtained by having T1w, T2w, and EPC as inputs according to an aspect of the present disclosure.

FIG. 8B is a graph plotting a total number of counted PVS in scan data and rescan data obtained by having T1w, T2w, and EPC as inputs. As shown in the graph, test-retest reliability is observed in PVS automated quantification regardless of the input image used. No difference between the number of PVS in scan and rescan is shown. Any observed difference may be trivial and due to segmentation imperfection, image intensity differences of scan-rescan signals (e.g., due to patient moving), and/or normal physiological changes of PVS (e.g., effects of time-of-day, sleep, and hydration on morphometric estimates of PVS).

Figure 9:
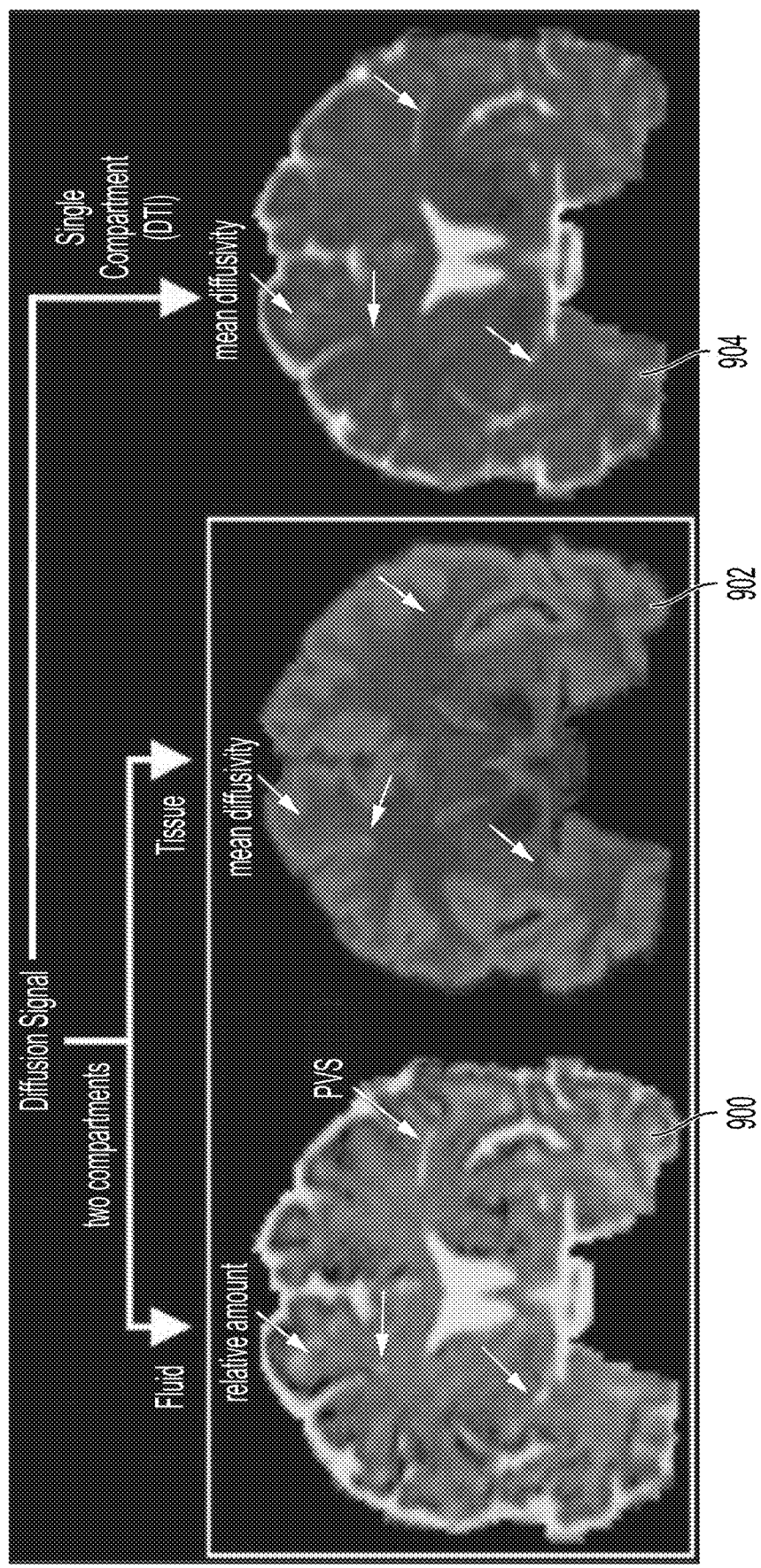
FIG. 9 illustrates fluid content, tissue diffusion, and mean diffusivity maps of a brain scan image according to an aspect of the present disclosure.

FIG. 9 illustrates a fluid content map 900, a tissue diffusion map 902, and a mean diffusivity map 904 of a brain scan image. The fluid content map 900 and the tissue diffusion map 902 may allow specific investigation into the source of an observed diffusion signal change in the tissue. The mean diffusivity map 904 of the DTI may be an average of both the fluid content map 900 and the tissue diffusion map 902. PVS fluid may be quantified using diffusion MRI. Diffusion signals may be derived from fluid and tissue compartments in voxels segmented as PVS from structural data. PVS diffusion properties may be extracted by separating the diffusion signals. A model based on a bi-tensor model that incorporates prior biological knowledge about the PVS fluid may be used to extract diffusion properties of the PVS fluid. The prior biological knowledge may be that PVS fluid has faster diffusivity compared to tissue fluid hindered by cellular bodies and processes.

Figure 10:
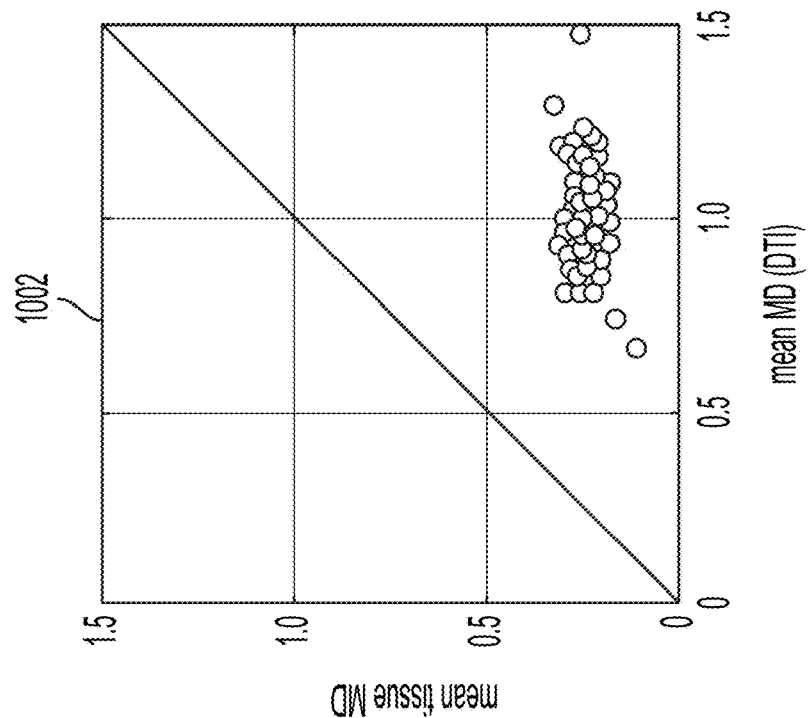
FIG. 10 is a set of graphs plotting mean diffusivity versus density in diffusion tensor imaging (DTI) and tissue tensor imaging (TTI) and mean diffusivity of DTI versus mean diffusivity of TTI according to an aspect of the present disclosure.
Figure 10:
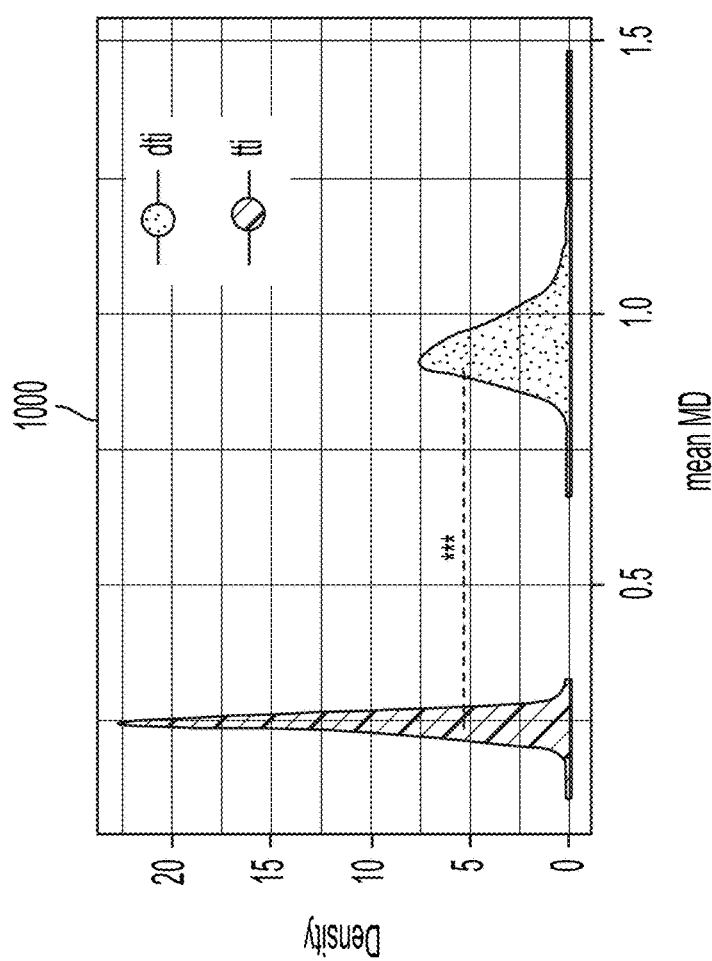

FIG. 10 is a graph 1000 plotting mean diffusivity versus density in DTI and TTI and a graph 1002 plotting mean diffusivity of DTI versus mean diffusivity of TTI. The graphs 1000, 1002 may demonstrate a quantitative investigation of the influence of PVS on diffusion signal. The graph 1000 shows DTI having a higher mean diffusivity but lower density than TTI. The DTI measure may be higher than TTI due to the presence of PVS. For example, as shown in graph 1002, mean diffusivity values from DTI may be approximately three times higher than TTI values.

Figure 11:
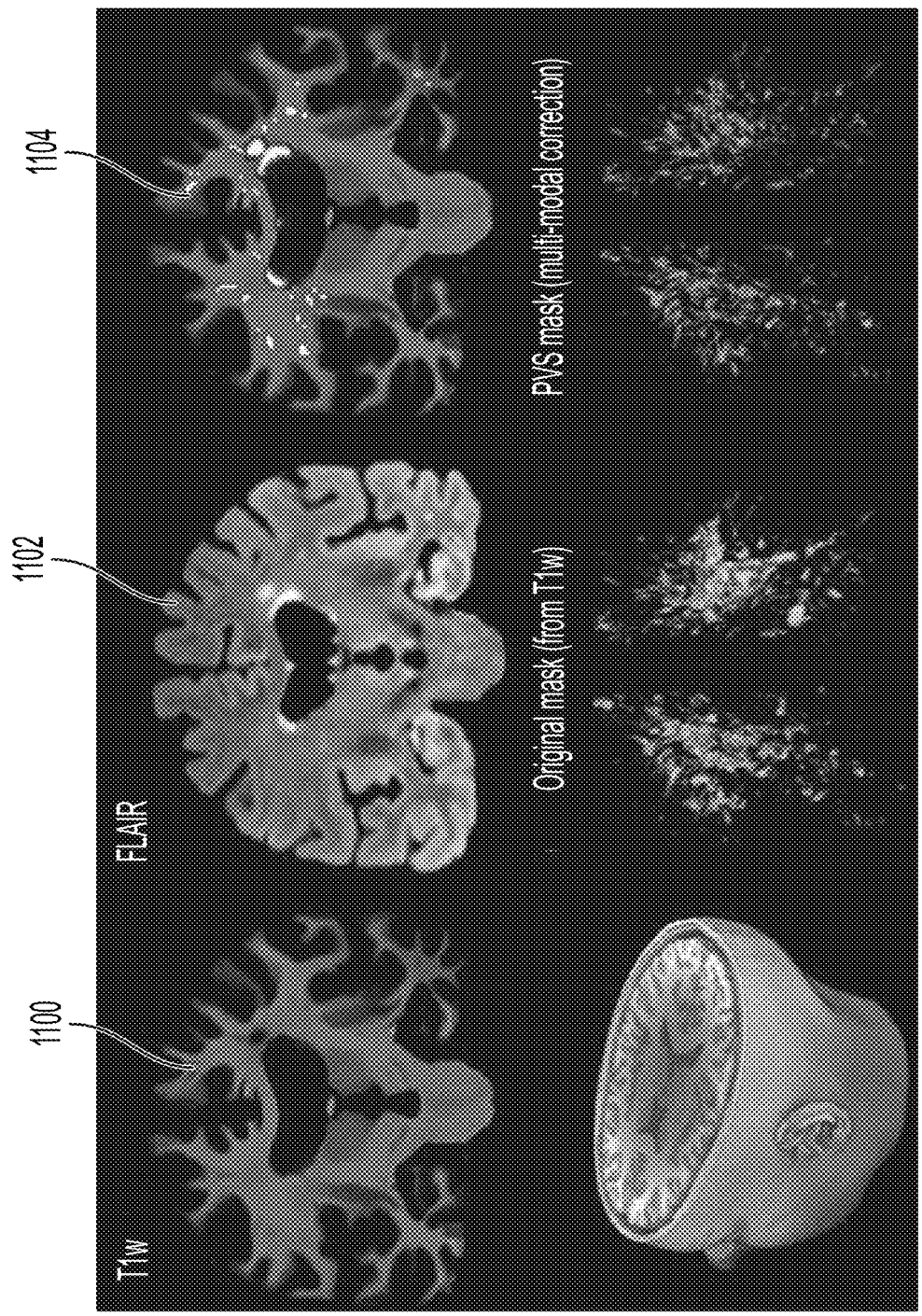
FIG. 11 illustrates a multi-modal PVS segmentation according to an aspect of the present disclosure.

FIG. 11 illustrates a multi-modal PVS segmentation. PVS may be mapped from a T1w image 1100 and white matter hyperintensities. White matter hyperintensities that may be falsely segmented as PVS may be excluded using a FLAIR image 1102. PVS segmentation may be quantified automatically using non-local filtering, Frangi filtering, and optimized mask identification. For each segmented voxel in the T1w image 1100, corresponding FLAIR voxels may be checked. If the FLAIR voxel value is a white matter hyperintensity, the voxel may be excluded in a final PVS mask 1104. For example, PVS voxels that are in the top ten percentile of the FLAIR signal distribution may be excluded from the PVS mask.

The performance of the automated PVS segmentation with and without white matter hyperintensity correction may be assessed using sensitivity or recall, precision or positive predictive value, and an F1 score or Dice similarity coefficient. The sensitivity, precision, and F1 score may be expressed as follows:

$$\text{Sensitivity} = \frac{TP}{TP + FN} \quad (9)$$

$$\text{Precision} = \frac{TP}{TP + FP} \quad (10)$$

$$F1 \text{ score} = \frac{2TP}{2TP + FP + FN} \quad (11)$$

TP may stand for true positive, or the number of segmented PVS voxels by algorithm which also belong to PVS voxels of the ground truth. FN may stand for false negative, or the number of segmented background voxels by algorithm which belong to PVS of the ground truth. FP may stand for false positive, or the number of segmented PVS voxels by algorithm which belong to background of ground truth.

Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A system for mapping brain perivascular spaces, comprising:
a memory to store one or more images of a brain of a patient;
a processor coupled to the memory and configured to:
obtain a first image of the brain of the patient, the first image including a first contrast,
obtain a second image of the brain of the patient, the second image including a second contrast,
combine the first image and the second image to form a combined image, the combined image preserving and magnifying structures including the brain perivascular spaces within the combined image of the brain of the patient, the combined image including a third contrast, the third contrast being higher than the first contrast and the second contrast,
determine the brain perivascular spaces within the combined image of the brain of the patient, and
generate a three-dimensional (3-D) map of the brain perivascular spaces within the brain of the patient; and
a display configured to display the perivascular spaces of the brain of the patient to an operator.

2. The system of claim 1, wherein the 3-D map of the brain perivascular spaces indicates a caliber, a distribution, an amount, a number, a volume or a volume fraction or a density of the brain perivascular spaces within the brain and within each region of the brain.

3. The system of claim 2, wherein the processor is configured to:
generate statistics of the brain perivascular spaces, wherein the statistics include the caliber, the distribution, the amount, the number, the volume or the volume fraction or the density of the brain perivascular spaces within the brain and within each region of the brain; and
provide the statistics of the brain perivascular spaces to the operator, wherein the statistics indicate, correlate with or relate to a neurological disease condition.

4. The system of claim 1, wherein the first image and the second image are high-resolution scans having different modalities with different contrasts from a magnetic resonance imaging device, wherein the different modalities include a T1-weighted modality and a T2-weighted modality that contrasts white matter and fluid patterns inversely in comparison to the T1-weighted modality wherein the high-resolution scans have a resolution of approximately 0.7 mm or less.

5. The system of claim 1, wherein the first image and the second image are low-resolution scans obtained from clinical data, wherein the low-resolution scans have a resolution of approximately 1 mm or greater.

6. The system of claim 1, wherein the processor is configured to:
perform pre-processing of the first image and the second image including at least one of non-uniform intensity normalization, motion correction, alignment correction, Talairach transform computation, skull stripping and intensity normalization; and
filter high-frequency noise from the first image and the second image to reduce high-frequency noise within the first image and the second image.

7. The system of claim 1, wherein to determine the brain perivascular spaces the processor is configured to:
applying a Frangi filter that provides a likelihood or a probability of each voxel being a brain perivascular space in the combined image; and
for each voxel, determining that the voxel is the brain perivascular space when the likelihood or the probability of the voxel is greater than or equal to a threshold value, wherein the threshold value is a modeled based on neurological data.

8. A system for mapping brain perivascular spaces using clinical data, comprising:
a memory to store one or more images of a brain of a patient;
a processor coupled to the memory and configured to:
obtain a combined image of the brain of the patient, the combined image generated by combining a first image and a second image of the brain of the patient, the first image including a first contrast, the second image including a second contrast, the combined image including a third contrast, the third contrast being higher than the first contrast and the second contrast,
determine the brain perivascular spaces within the combined image of the brain of the patient, and
generate a three-dimensional (3-D) map of the brain perivascular spaces; and
a display configured to display or render an image of the brain perivascular spaces of the brain of the patient to an operator.

9. The system of claim 8, wherein the first image has a T1-weighted modality and the second image has
a FLAIR modality that suppresses fluids in the first image while providing a high contrast for lesions including segmenting or excluding lesions or microbleeds from the first image based on the first image and the other image having the FLAIR modality; and
optimizing lesion detection techniques using machine learning.

10. The system of claim 8, wherein to determine the brain perivascular spaces the processor is configured to:
applying a Frangi filter that provides a likelihood or a probability of each voxel being a brain perivascular space; and
for each voxel, determining that the voxel is the brain perivascular space when the likelihood or the probability of the voxel is greater than or equal to a threshold value, wherein the threshold value is a modeled based on neurological data.

11. A method for analyzing brain perivascular spaces, comprising:
obtaining a first image of a brain of a patient, the first image including a first contrast;
obtaining a second image of the brain of the patient, the second image including a second contrast;
combining the first image and the second image to form a combined image, the combined image preserving and magnify structures including the brain perivascular spaces within the brain of the patient, the combined image including a third contrast, the third contrast being higher than the first contrast and the second contrast;
determining the brain perivascular spaces within the combined image of the brain of the patient;
determining fluid characteristics within the brain;
generating a map of the brain perivascular spaces along with fluid characteristics within the brain of the patient; and
displaying the map of the brain perivascular spaces along with the fluid characteristics within the brain of the patient.

12. The method of claim 11, further comprising:
obtaining diffusion magnetic resonance imaging scans over a period of time;
wherein determining the fluid characteristics within the brain includes measuring or determining diffusion or motion hydrogen molecules at the microscopic or molecular level using diffusion magnetic resonance imaging scans over the period of time.

13. The method of claim 12, wherein determining the diffusion or the motion of the hydrogen molecules includes decomposing or separating the diffusion or the motion of the hydrogen molecules inside white matter diffusion or fluid diffusion based on a speed of a motion or the motion of the hydrogen molecules, wherein the fluid diffusion is a faster diffusion than the white matter diffusion.

* * * * *

UNITED STATES PATENT AND TRADEMARK OFFICE
CERTIFICATE OF CORRECTION

PATENT NO. : 11,908,131 B2
APPLICATION NO. : 17/176725
DATED : February 20, 2024
INVENTOR(S) : Farshid Sepehrband and Jeiran Choupan It is certified that error appears in the above-identified patent and that said Letters Patent is hereby corrected as shown below:

In the Specification

Column 1, Lines 15-19:
The "STATEMENT AS TO FEDERALLY SPONSORED RESEARCH" should read:
This invention was made with government support under grant numbers NS100973, EB015922, AG052350, and AG005142 awarded by the National Institutes of Health (NIH). The government has certain rights in this invention.

Signed and Sealed this
Ninth Day of April, 2024

Katherine Kelly Vidal
*Director of the United States Patent and Trademark Office*